United States Patent
Matsuura et al.

(10) Patent No.: US 6,670,701 B2
(45) Date of Patent: Dec. 30, 2003

(54) SEMICONDUCTOR MODULE AND ELECTRONIC COMPONENT

(75) Inventors: Tetsuya Matsuura, Hyogo (JP); Yasushi Kasatani, Hyogo (JP); Kazunari Michii, Hyogo (JP); Hajime Maeda, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 7 days.

(21) Appl. No.: 10/000,031

(22) Filed: Dec. 4, 2001

(65) Prior Publication Data

US 2002/0100965 A1 Aug. 1, 2002

(30) Foreign Application Priority Data

Feb. 1, 2001 (JP) .......................... 2001-025334
Jun. 12, 2001 (JP) .......................... 2001-177461

(51) Int. Cl.[7] .............................................. H01L 23/02
(52) U.S. Cl. ...................... 257/686; 257/685; 257/777
(58) Field of Search ................................ 257/685, 686, 257/777, 666, 778

(56) References Cited

U.S. PATENT DOCUMENTS

| 5,138,438 A | * | 8/1992 | Masayuki et al. |
| 5,677,569 A | | 10/1997 | Choi |
| 5,744,827 A | * | 4/1998 | Jeong et al. |
| 5,994,166 A | * | 11/1999 | Akram et al. |
| 6,051,878 A | * | 4/2000 | Akram et al. |
| RE36,916 E | * | 10/2000 | Moshayedi |
| 6,137,163 A | * | 10/2000 | Kim et al. |
| 6,188,127 B1 | * | 2/2001 | Senba et al. |
| 6,297,548 B1 | * | 10/2001 | Moden et al. |
| 6,333,562 B1 | * | 12/2001 | Lin |
| 6,340,846 B1 | * | 1/2002 | LoBianco et al. |
| 6,365,963 B1 | * | 4/2002 | Shimada |
| 6,531,784 B1 | * | 3/2003 | Shim et al. |

FOREIGN PATENT DOCUMENTS

| JP | 4-276649 | 10/1992 |
| JP | 7-14980 | 1/1995 |
| JP | 9-107065 | 4/1997 |
| JP | 9-121017 | 5/1997 |
| JP | 2000-124400 | 4/2000 |
| JP | 2000-156460 | 6/2000 |
| JP | 2000-156465 | 6/2000 |
| JP | 2000-252419 | 9/2000 |

* cited by examiner

Primary Examiner—Sheila V. Clark
(74) Attorney, Agent, or Firm—Leydig, Voit & Mayer, Ltd.

(57) ABSTRACT

A semiconductor module achieving higher density of the semiconductor module itself as well as of being disposed in an area-efficient manner relative to another electronic component, such as a mother board and the like. The semiconductor module includes a mounting substrate having, on an underside, a solder ball for connecting to an interconnection of a mother board and semiconductor packages mounted in multiple layers on the top side of the mounting substrate and connected to electrodes on the mounting substrate.

16 Claims, 19 Drawing Sheets

SEMICONDUCTOR MODULE AND ELECTRONIC COMPONENT

BACKGROUND OF THE INVENTION

1. Field of the Invention

The present invention relates to a semiconductor module and an electronic component, and specifically, to a semiconductor module that is small and capable of mounting semiconductor chips in high density and that can be mounted in high density onto another electronic component, and an electronic component having such semiconductor module mounted thereon.

2. Description of the Background Art

FIG. 31 is a front view showing an example of a memory module structure of a conventional semiconductor module, and FIG. 32 is a plan view thereof. On a surface side and an underside of a mounting substrate 101, semiconductor packages 104 and 124 are mounted. This mounting substrate 101 is connected to another electronic component by an external lead 107 connected to an interconnection pattern (not shown) provided on mounting substrate 101. Semiconductor package 104 has a semiconductor chip sealed by resin, and is connected to an interconnection pattern on mounting substrate 101 via external leads 103 and 123. Another example of an electronic component having one layer of memory module 110 mounted on each side is a mother substrate 150 as shown in FIG. 33. In FIG. 33, external leads 107 for memory modules 110a, 110b, and 110c are connected to an interconnection pattern (not shown) of mother substrate 150. Thus, high packaging density could be achieved by disposing semiconductor packages 104 and 124 in two layers on mounting substrate 101.

Higher levels of smaller scale, higher density memory modules to be mounted on a portable telephone, portable terminal equipment or the like are constantly required along with the advances of the information technology oriented society. It has become difficult to satisfy the demand for such smaller scale, higher density memory modules merely by improving upon the memory module having a structure shown in FIGS. 31 to 33. Thus, in order to achieve higher density in the memory capacity of a memory module, for instance, a memory module as shown in FIG. 34 has been disclosed (Japanese Patent Laying-Open No. 4-276649). According to this memory module 110, three semiconductor packages 104a, 104b, and 104c are mounted on a single side so that the memory capacity per unit area of memory module 110 can be made higher in density than that of the memory module shown in FIGS. 31 to 33.

Until now, however, the approach of high density packaging involved achieving high density in the memory capacity only within memory module 110 so that it lacked the viewpoint of effecting high density packaging with respect to disposition of memory module 110 to mother substrate 150. In other words, it was never attempted to reduce the area per memory module on mother substrate 150. For improvement, it is desirable to dispose a memory module on a mother substrate in an area-efficient manner so as to allow mounting of one extra memory module in addition to what was conventionally provided, for instance. Such efficient disposition, when implemented, would greatly contribute to achieving higher density in the memory capacity. As shown in FIG. 33, in a conventional memory module having semiconductor packages mounted in multiple layers, memory module 110 is mounted on mother substrate 150 using external lead 107 of the mounting substrate.

SUMMARY OF THE INVENTION

An object of the present invention is to provide a semiconductor module that achieves higher density in the semiconductor module itself on which semiconductor packages such as memory modules are provided in multiple layers and that can be mounted in high density on another electronic component such as a mother substrate, and an electronic component having such semiconductor module mounted thereon.

In addition, another object of the present invention is to provide a semiconductor module which has the characteristics of the above-described semiconductor module as well as high stability in that it is not affected by slight variation in manufacturing conditions, which allows easy reworking of defect that occurs during the production, and which can maintain high yield even during high efficiency production, and an electronic component having such semiconductor module mounted thereon.

The semiconductor module according to the present invention includes a mounting substrate having on an underside a solder ball for connecting to interconnection of another electronic component, and a plurality of semiconductor packages mounted in multiple layers on a surface side of the mounting substrate and connected to an electrode provided on the mounting substrate.

The present semiconductor module is connected to another electronic component by a solder ball provided on the underside. Thus, when mounted on another electronic component, a mother substrate, for instance, the semiconductor module only occupies a small area. Consequently, a greater number of semiconductor modules can be mounted on the mother substrate for the same area so that such arrangement greatly contributes to achieving a smaller scale, higher density packaging for a portable telephone, portable terminal equipment, or the like. The above-described semiconductor packages can be stacked with one's top side being contact with another's underside, or with one top side distanced from one underside. When the semiconductor packages are stacked with one's top side being contact with another's underside, the height of the above-described semiconductor module can be reduced so that the volume of the semiconductor module can be further reduced. As a result, further improvement in smaller scale and higher density packaging can be achieved. In the above as well as in the following description, the term "connection" signifies both an electrical connection and a mechanical connection for providing support.

In the semiconductor module according to the present invention, for instance, in the plurality of the semiconductor packages, lead nominal dimensions, which are the distances between electrodes to which lead terminals of the semiconductor packages are connected, and package heights, which are the heights between the electrodes and a semiconductor chip sealed by resin, all differ respectively.

According to this arrangement, multilayer packaging on a mounting substrate can be achieved using external leads and without using other members for mounting. Thus, the number of components can be reduced so that the manufacturing cost can be reduced.

In the semiconductor module according to the present invention, for instance, a spacer substrate is provided that has a connecting portion and an interconnection pattern and that is disposed outside of the semiconductor packages when seen in a plane, and in a semiconductor package, a lead terminal of the semiconductor package can be connected to the connecting portion of the spacer substrate.

According to this arrangement, semiconductor packages of the same dimension can be systematically disposed in multiple layers and supported without varying the package heights and the lead nominal dimensions of external leads extending from a plurality of semiconductor packages to make the heights and the dimensions differ. Thus, the need to produce many kinds of semiconductor packages having external leads of different shapes can be eliminated. As a result, it becomes possible to produce the semiconductor modules efficiently and with high yield. Moreover, the length of an external lead extending from the semiconductor package can be made shorter than the above-described semiconductor package so that strong support for the semiconductor package can be provided. Here, the connecting portion forms a terminal portion of the interconnection pattern.

In the semiconductor module according to the present invention, for instance, sub-substrates, each having an interconnection pattern and an external lead and having a smaller planar size than the mounting substrate, are provided in multiple layers on the mounting substrate, and an external lead of each of the sub-substrates is connected to an electrode of the mounting substrate, and thus the semiconductor package can be mounted on the sub-substrate.

According to this arrangement, a semiconductor package is mounted on a sub-substrate and the sub-substrate is mounted on a mounting substrate so that the process can be divided into several steps, which simplifies the packaging steps. Preferably, the external leads for the plurality of sub-substrates have varying heights and also are located in different planar positions. The semiconductor packages may be mounted on both sides of the sub-substrate, or a semiconductor package may be mounted on one side only. In addition, the semiconductor packages may or may not make contact with one another, or the semiconductor package and a surface of a sub-substrate may or may not make contact. When the semiconductor packages make contact with one another, or the semiconductor package and a surface of the sub-substrate make contact, the height of the semiconductor module can be reduced so that smaller scale and higher density packaging can be effectively achieved.

In the semiconductor module according to the present invention, for instance, sub-substrates, each having an interconnection pattern and a through hole and having a smaller planar size than the mounting substrate, are provided in multiple layers on the mounting substrate by being supported by a contact pin that passes through the through hole, and the contact pin is connected to the interconnection pattern of the sub-substrate via the through hole and connected to an electrode of the mounting substrate, and thus the semiconductor package can be mounted on the sub-substrate.

According to this arrangement, interconnection patterns of the sub-substrates disposed in multiple layers can be easily connected together using a plurality of contact pins. Thus, it becomes possible to perform the packaging steps efficiently and with high yield.

In the semiconductor module according to the present invention, for instance, two standing wall-like sub-substrates are provided that are disposed such that they intersect the mounting substrate and they face one another, the standing wall-like sub-substrates each have an interconnection pattern and a through hole into which a lead terminal is to be inserted, a standing wall-like sub-substrate is connected by soldering to an electrode of the mounting substrate, the lead terminal of the semiconductor package is inserted into the through hole, and thus the semiconductor package can be mounted.

According to this arrangement, the external leads of all semiconductor packages can be made shorter. As a result, it becomes possible to produce the semiconductor modules efficiently and with high yield. Moreover, the semiconductor packages can be supported firmly. Furthermore, by adjusting the distance between the through holes in the vertical direction, the height of the semiconductor module can be reduced. Although the external leads of the semiconductor module may be linear or curved like a gull-wing type, linear leads would simplify the manufacturing steps.

In the semiconductor module according to the present invention, for instance, a recessed portion that reduces the thickness of the mounting substrate across a range including the semiconductor packages when seen in a plane can be provided on a surface side of the mounting substrate.

According to this arrangement, by having a semiconductor package received in the recessed portion, the semiconductor package is mounted on the surface side of the mounting substrate with the thickness of the semiconductor package overlapping that of the mounting substrate. Thus, the thickness of the semiconductor module becomes thinner, and smaller scale and higher density packaging can be further achieved. Moreover, the semiconductor package received in the recessed portion need not be completely received in the recessed portion in its entire thickness, but may partially protrude.

In the semiconductor module according to the present invention, for instance, a semiconductor package can also be mounted on the underside and be connected to an electrode provided on the underside.

According to this arrangement, a semiconductor package can be mounted not only on the surface side but on the underside of the mounting substrate as well. For instance, when the semiconductor package is connected to an electrode of the interconnection pattern of the mounting substrate via external leads, a long external lead is required for the outermost layer of the semiconductor packages in which many layers of semiconductor packages are stacked. As in this arrangement, however, when semiconductor packages are disposed on both sides, the number of layers can be reduced so that the external lead for the semiconductor package of the outermost layer need not be made extremely long.

In the semiconductor module according to the present invention, for instance, a recessed portion that reduces the thickness of the mounting substrate across a range including the semiconductor packages when seen in a plane is provided on an underside of the mounting substrate, and the semiconductor package disposed on the underside can be disposed in the recessed portion.

According to this arrangement, by having a semiconductor package received in the recessed portion, the semiconductor packages can be mounted not only on the surface side but also on the underside of the mounting substrate without causing a problem to the connection to the mother substrate via a solder ball. In this case, it is not necessary for the semiconductor package to be entirely received within the recessed portion, and the semiconductor package may protrude by about the height of a solder ball as long as it does not obstruct the connection via the solder ball provided on the underside. Since the semiconductor package is mounted such that it overlaps the thickness of the mounting substrate, the thickness of the semiconductor module becomes thinner, and smaller scale and higher density packaging can be further achieved.

In the semiconductor module according to the present invention, for instance, a spacer substrate having an interconnection pattern and a solder ball is disposed on the underside of the mounting substrate in a location outside of the semiconductor package located on the underside when seen in a plane, and the semiconductor package disposed on the underside can be disposed between spacer substrates.

According to this arrangement, without reducing the thickness of the mounting substrate to form the recessed portion, the recessed portion can be easily formed by spacer substrates. Thus, the semiconductor packages can be disposed on the surface side and the underside without reducing the rigidity and the like of the mounting substrate.

In the semiconductor module according to the present invention, for instance, the spacer substrate can be connected to the mounting substrate by a solder material.

According to this arrangement, the spacer substrate having a solder ball can be mounted on the mounting substrate using the solder material. Thus, the semiconductor module can be mounted easily with small occupied area to the interconnection pattern of the mother substrate or the like.

In the semiconductor module according to the present invention, for instance, the solder material is a solder ball attached to the mounting substrate, and the spacer substrate having the solder ball can be connected to the mounting substrate via the solder ball.

According to this arrangement, using the mounting substrate having a solder ball on its underside, a recessed portion can be easily formed on the underside, and the semiconductor package can be disposed in the recessed portion. Thus, there is no need to increase the number of different kinds of the mounting substrates so that the inventory can be reduced.

In the semiconductor module according to the present invention, a dummy solder material forming a junction that is not utilized for signal transmission may be provided on the underside of the mounting substrate.

By disposing and connecting the above-described dummy solder material to an electrode and the like of a mother substrate, the stress is shared and distortion is limited so that the heat cycle resistance can be improved in the junction that utilizes a solder ball with which signal transmission is performed. In addition, the above-described solder material may be a solder ball or a solder material other than the solder ball.

In the semiconductor module according to the present invention, a spacer substrate disposed on the underside of the mounting substrate is preferably a frame-like spacer substrate whose four sides are continuous so as to surround a semiconductor package disposed on the underside.

According to this arrangement, if a defect is found in the semiconductor package after the semiconductor module is mounted on the mother substrate, and the semiconductor package is to be replaced, it becomes possible easily to pull out the semiconductor module together with a spacer substrate using a removing jig. As a result, the situation where the spacer substrate alone being left on the mother substrate as it would be the case in the conventional example would no longer occur so that it becomes possible to change the defective semiconductor package alone while allowing the mother substrate to be utilized.

In the semiconductor module according to the present invention, the spacer substrate disposed on the underside of the mounting substrate can be provided with a portion that protrudes outward from the mounting substrate when seen in a plane.

According to this arrangement, when a plurality of semiconductor modules are produced simultaneously, space can be provided between the mounting substrates of the respective semiconductor modules. Consequently, when the mounting substrates are to be divided at a prescribed stage, a tip of a mounting substrate-dividing machine can be inserted in the space between the mounting substrates so as to divide and obtain the respective semiconductor modules with ease. As a result, it becomes possible to produce the semiconductor modules with high yield and high efficiency without erroneously cutting or damaging the substrate during such division.

In the semiconductor module according to the present invention, lead terminals of the semiconductor packages mounted in multiple layers on the surface side can be arranged so that one lead terminal does not overlap another when seen in a plane.

According to this arrangement, a connecting portion to a mounting substrate electrode terminal of an external lead of the semiconductor modules mounted in multiple layers can be visually inspected with ease and very high efficiency. As a result, it becomes possible to achieve significantly higher efficiency in the visual inspection process.

An electronic component according to the present invention has a semiconductor module mounted thereon, where an electrode of an interconnection pattern of the electronic component is connected to a solder ball disposed on an underside of any one of the semiconductor modules according to the present invention.

According to this arrangement, the semiconductor modules can be mounted in high density, or the area for mounting the semiconductor modules can be reduced, which leads to a smaller scale portable telephone or portable terminal equipment. A mother substrate and the like correspond to the above electronic component.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described using the drawings.

First Embodiment

Figure 1:
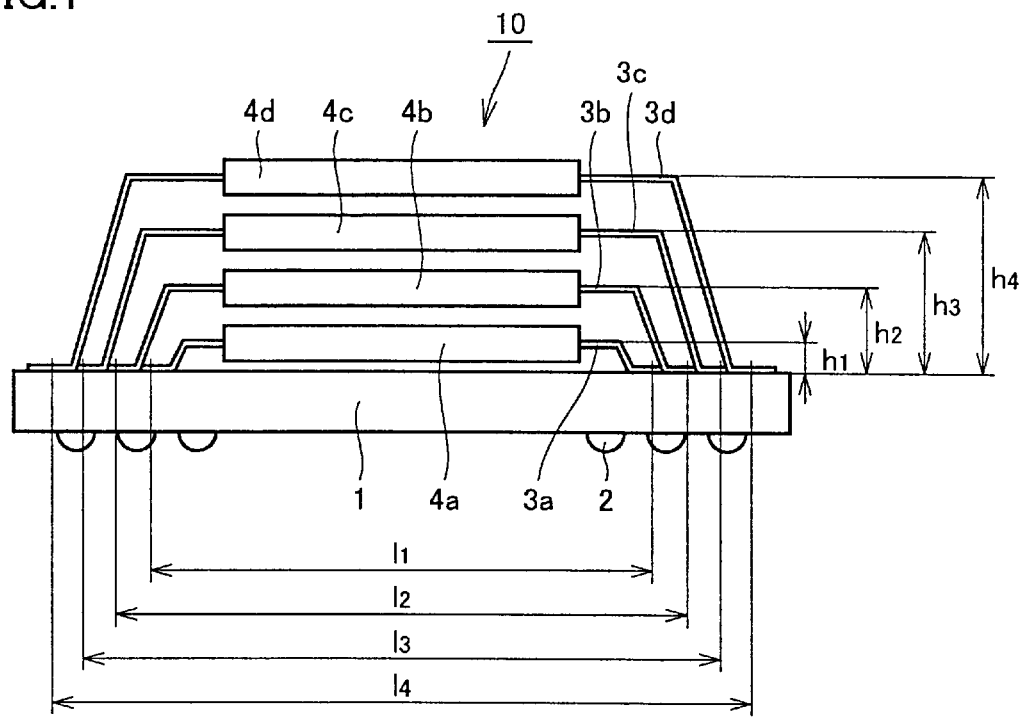
FIG. 1 is a front view representing a semiconductor module according to a first embodiment of the present invention.
Figure 2:
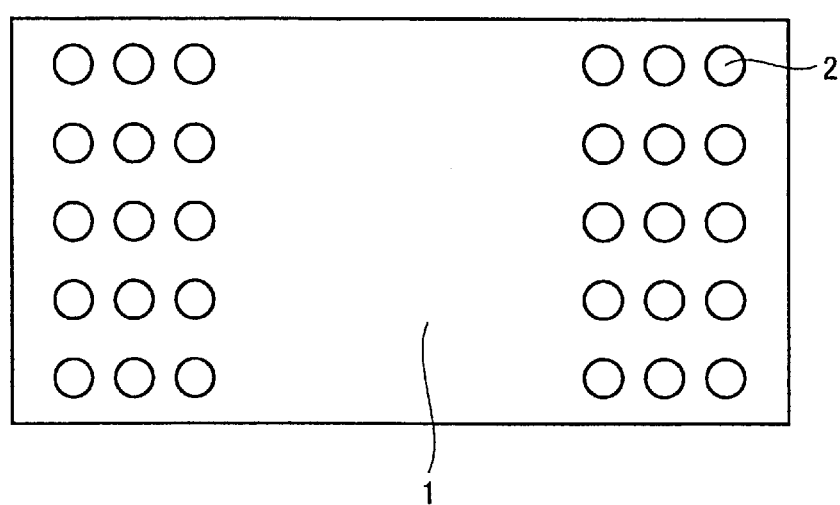
FIG. 2 is a plan view of the semiconductor module of FIG. 1 seen from the underside.

As shown in FIGS. 1 and 2, external leads (lead terminals) $3a$, $3b$, $3c$, and $3d$ extend from semiconductor packages $4a$, $4b$, $4c$, and $4d$, and are connected to connecting portions (not shown) of a mounting substrate. The lead nominal dimensions $l_1$, $l_2$, $l_3$, and $l_4$ that are the distances between the right and left positions at which the external leads are connected to the connecting portions of the mounting substrate and the package heights $h_1$, $h_2$, $h_3$, and $h_4$ that are the distances from the connecting portions to the respective semiconductor packages all differ. With such an arrangement, a plurality of semiconductor packages can be systematically stacked in multiple layers and supported without one semiconductor package interfering with another. As a result, a higher density of the semiconductor module itself can be achieved.

Figure 3:
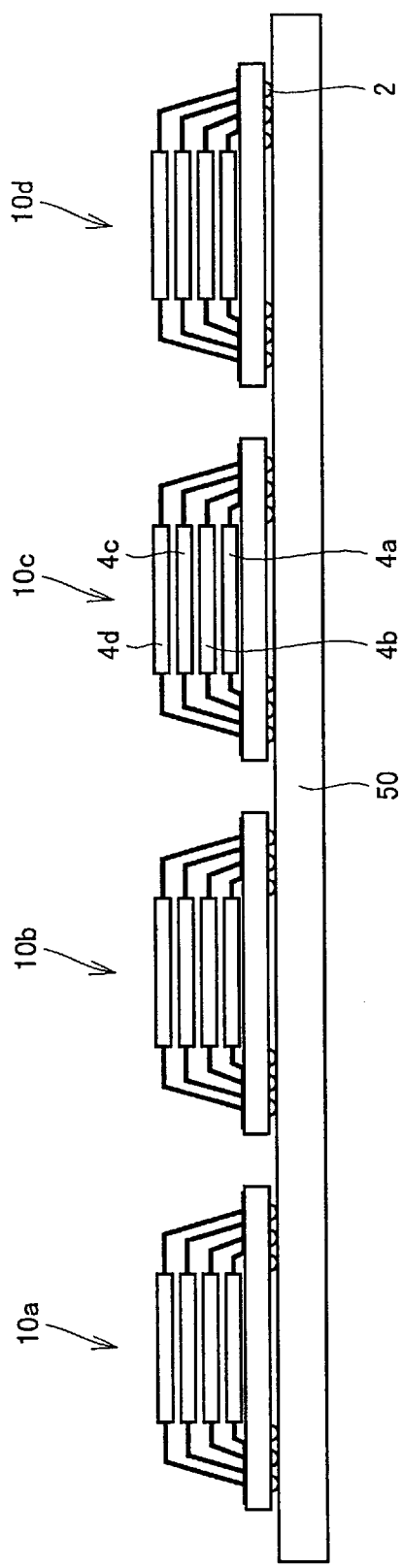
FIG. 3 is a front view showing the semiconductor module according to the first embodiment of the present invention mounted on a mother substrate.
Figure 33:
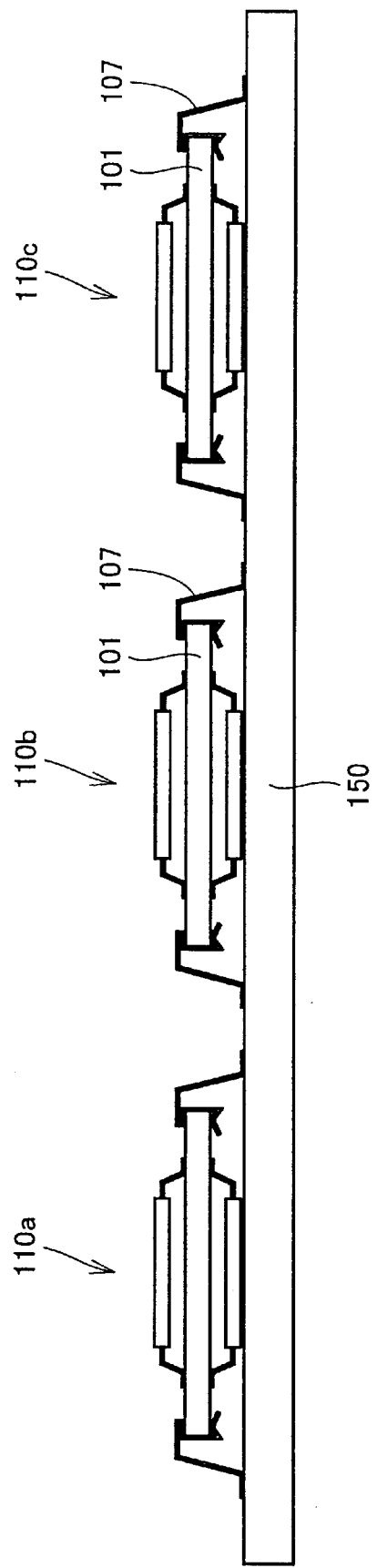
FIG. 33 is a front view showing the conventional semiconductor module mounted on a mother substrate.
Figure 34:
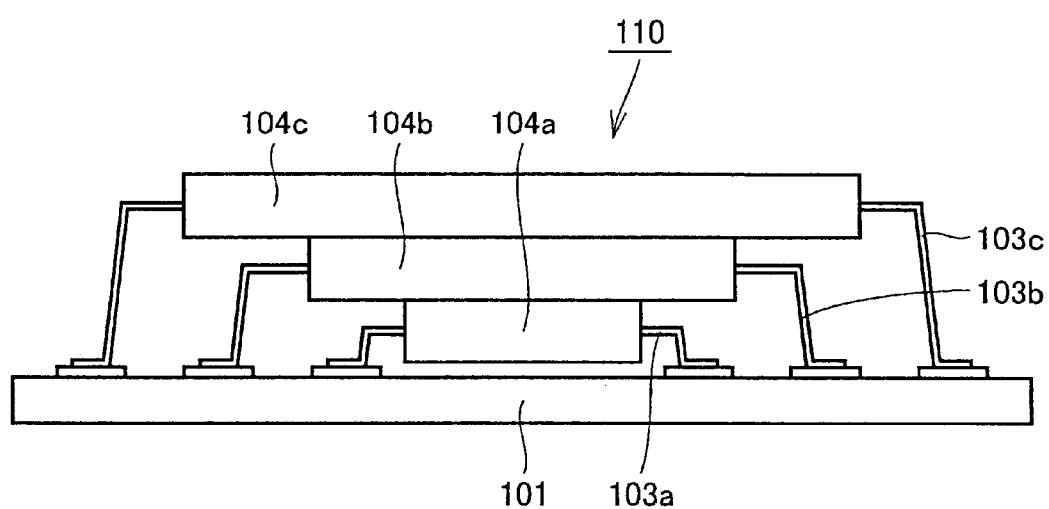
FIG. 34 is a front view of another conventional semiconductor module.

In addition, a solder ball 2 in FIG. 2 is connected to a connecting portion of another electronic component, for instance, the mother substrate, without increasing the substantial area of a semiconductor module 10. FIG. 3 is a front view showing a stage where such semiconductor module 10 is being mounted on a mother substrate 50. When compared with the case where conventional memory modules are mounted on the mother substrate shown in FIG. 33, one additional row, that is, four rows of $10a$, $10b$, $10c$, and $10d$ instead of the conventional three rows, of the semiconductor modules can be mounted. Thus, the packaging density can be improved by more than 30% in comparison to the conventional example. This is achieved by pursuing greater area efficiency in the mounting of semiconductor modules to another electronic component such as a mother substrate. The semiconductor module shown in FIGS. 1 to 3 not only realizes higher density of the semiconductor module itself but also greatly contributes to achieving higher density in another electronic component when this high density semiconductor module is mounted on such electronic component.

In all of the following embodiments, the mounting area of semiconductor modules to another electronic component can be reduced to allow higher density packaging in another electronic component as shown in FIG. 3. The drawings, however, would be identical to FIG. 3 so that the illustration will not provided.

Second Embodiment

Figure 4:
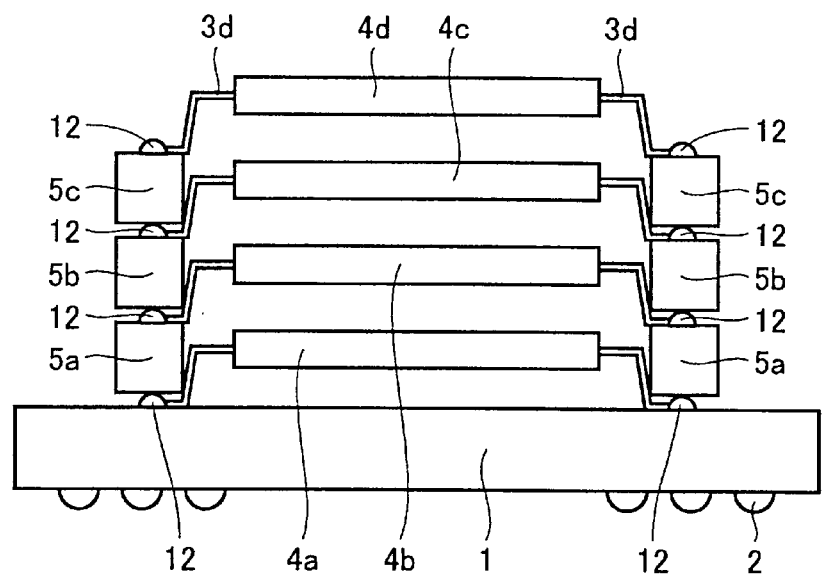
FIGS. 4, 5, and 6 are front views showing semiconductor modules according to the second to fourth embodiments of the present invention.

In FIG. 4, an external lead $3d$ extending from a semiconductor package $4d$ in a location remotest from a mounting substrate 1 is connected to the interconnection (not shown) of a spacer substrate $5c$ with solder material 12 and the like. Other semiconductor packages $4c$, $4b$ and $4a$ have their external leads $3c$, $3b$, and $3a$ respectively connected to spacer substrates $5b$ and $5a$ and a connecting portion on the substrate via solder material 12. Spacer substrates, when seen in a plane, surround the semiconductor packages like a frame.

With this structure, semiconductor packages of the same dimension can be systematically disposed in multiple layers and supported without varying the package heights and the lead nominal dimensions of external leads extending from a plurality of semiconductor packages to make the heights and the dimensions differ. Thus, the need to produce many kinds of semiconductor packages having external leads of different shapes can be eliminated. As a result, it becomes possible to produce the semiconductor modules efficiently and with high yield. Moreover, the length of an external lead extending from the semiconductor package can be made shorter than that of the semiconductor package of the first embodiment so that strong support can be provided for the semiconductor package.

Third Embodiment

Figure 5:
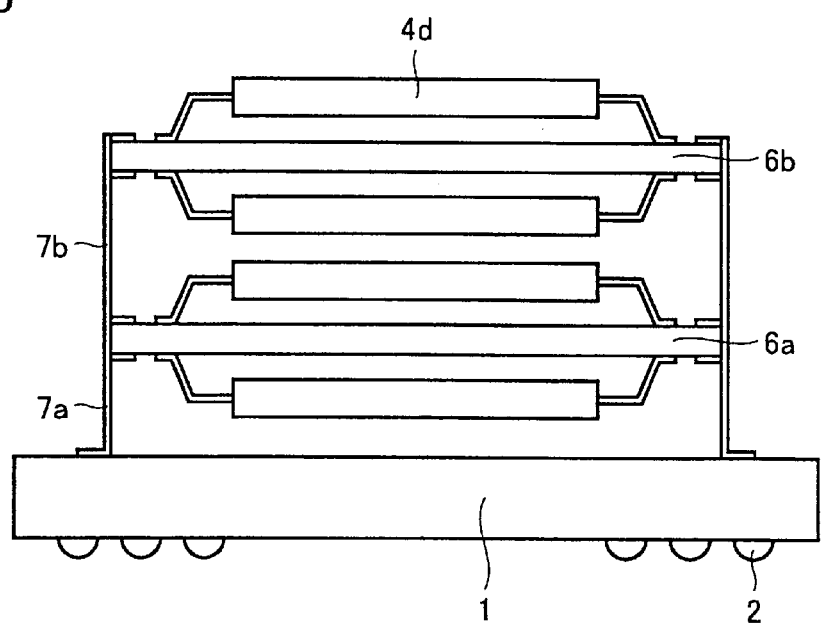

In the semiconductor module of FIG. 5, two sub-substrates $6a$ and $6b$ are disposed, and on a top side and an underside of each sub-substrate, semiconductor packages are connected to the interconnection pattern of the sub-substrate via external leads. The sub-substrates are connected to and supported on mounting substrate 1 by the respective external leads 7a and 7b connected to the interconnection patterns of the sub-substrates.

With this structure, the respective external leads of the semiconductor packages may be shorter than the external lead of the semiconductor package of the first embodiment and may be of the same shape. Thus, it is not necessary to machine the external leads of the semiconductor packages such that the shapes of the leads differ from one another so that semiconductor modules can be produced efficiently and with high yield.

Fourth Embodiment

Figure 6:
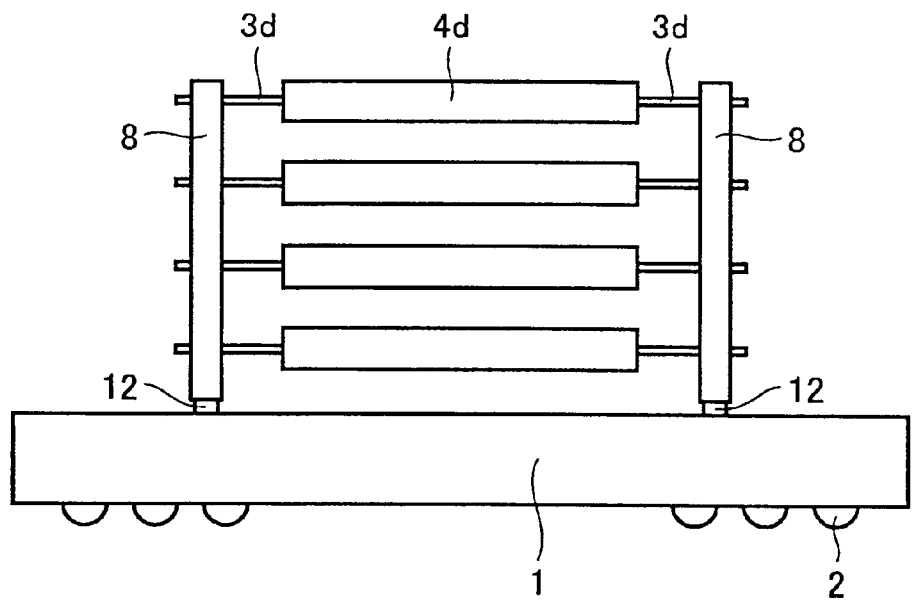
Figure 7:
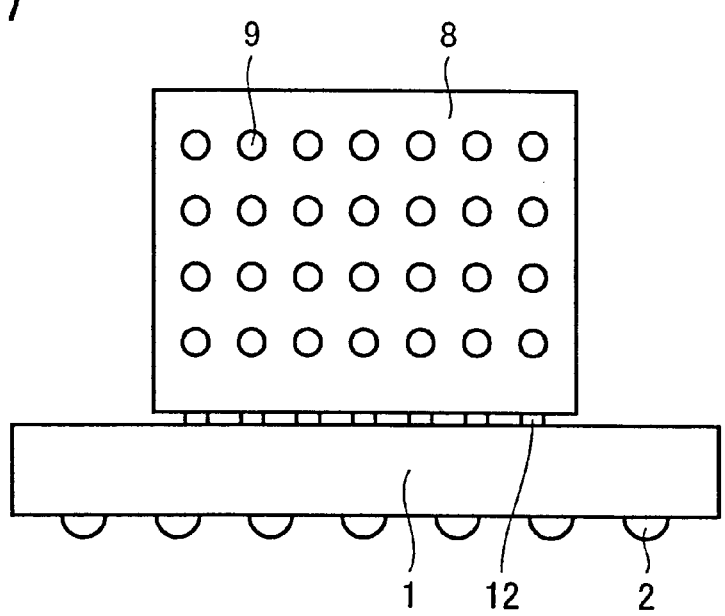
FIG. 7 is a side view of the semiconductor module shown in FIG. 6.

In FIG. 6, the semiconductor packages are disposed between two standing wall-like sub-substrates 8 facing one another. As shown in FIG. 7, in a standing wall-like sub-substrate 8, through holes 9 are provided where connecting portions connected to the interconnection pattern (not shown) are exposed, and the external leads extending from the semiconductor packages are inserted into through holes 9 and fixed with solder material and the like. Thus, the external lead of any of the semiconductor packages can be linear and can be made short. As a result, the semiconductor modules can be produced efficiently and with high yield. In addition, the semiconductor packages can be supported firmly. Further, since no such sub-substrate as the one in the semiconductor module of the third embodiment is required, the height of the semiconductor module can be lowered by adjusting a distance between through holes in the vertical direction. Similarly, the respective heights of the semiconductor modules in the first and the second embodiments can be made lower than that in the third embodiment.

Figure 8:
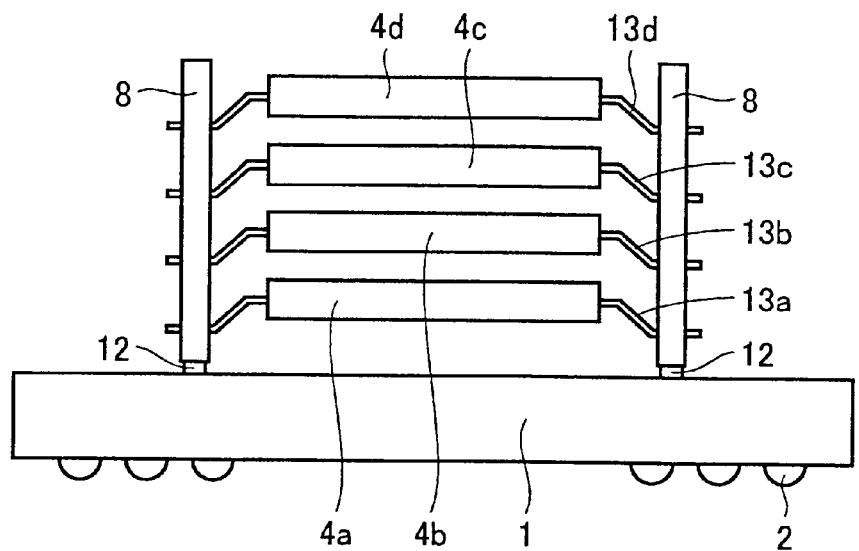
FIG. 8 is a front view of a modification of the semiconductor module according to the fourth embodiment of the present invention.

FIG. 8 is a front view showing a semiconductor module of a modification to the fourth embodiment of the present invention. In this semiconductor module, the external leads extending from the semiconductor packages are of gull-wing type. Although the use of the gull-wing type external leads slightly increases the height of a semiconductor module in comparison with the semiconductor module of FIG. 6, the semiconductor modules can still be produced efficiently and with high yield. In addition, the semiconductor packages can be supported firmly.

Fifth Embodiment

Figure 9:
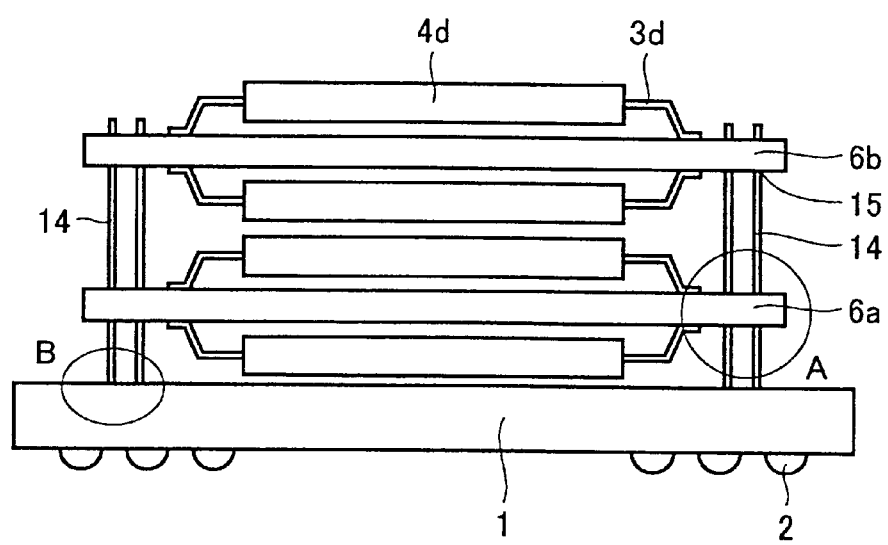
FIG. 9 is a front view of a semiconductor module according to a fifth embodiment of the present invention.
Figure 10:
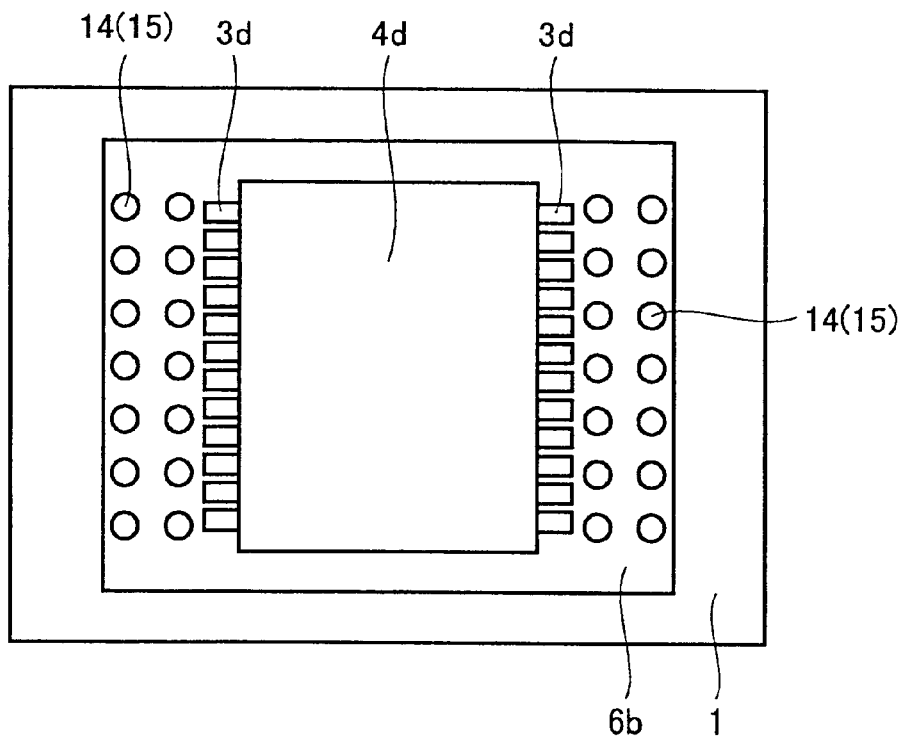
FIG. 10 is a plan view of the semiconductor module of FIG. 9 seen from the surface side.
Figure 11:
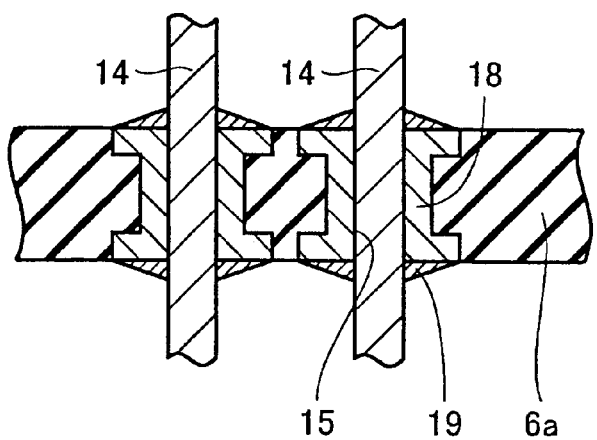
FIGS. 11 and 12 are enlarged cross sectional views respectively showing a portion A and a portion B of FIG. 9.
Figure 12:
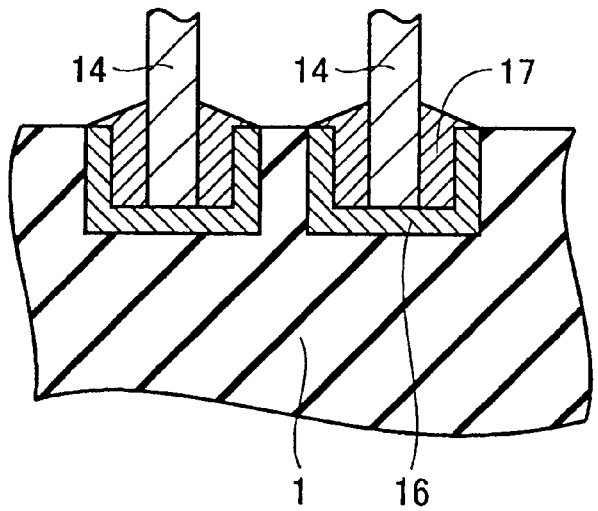

In the semiconductor module shown in FIG. 9, two sub-substrates 6a and 6b are stacked in multiple layers, and contact pins 14 are used for their support. Through holes 15 are provided in sub-substrates 6a and 6b as shown in FIG. 10, and contact pins 14 are inserted through the through holes. As shown in FIG. 11 which is an enlarged cross sectional view of a portion A in FIG. 9, a through hole electrode pattern 18 is provided in the through hole, and contact pin 14 is fixed to the through hole electrode pattern using solder material 19. In addition, as shown in FIG. 12 which is an enlarged cross sectional view of a portion B in FIG. 9, contact pin 14 is fixed to mounting substrate 1 by fixing contact pin 14 to an indented-type electrode pattern 16 on the mounting substrate using solder material 17. The through hole electrode pattern and the electrode pattern on the mounting substrate are formed by a conductive material such as copper.

The semiconductor module according to this embodiment can also be produced efficiently and with high yield.

Sixth Embodiment

Figure 13:
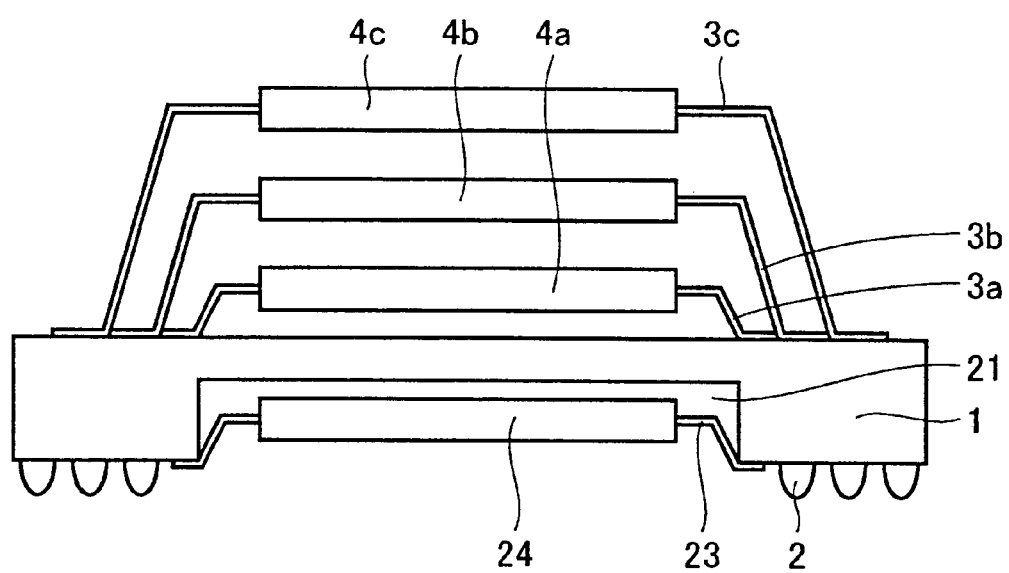
FIG. 13 is a front view of a semiconductor module according to a sixth embodiment of the present invention.
Figure 14:
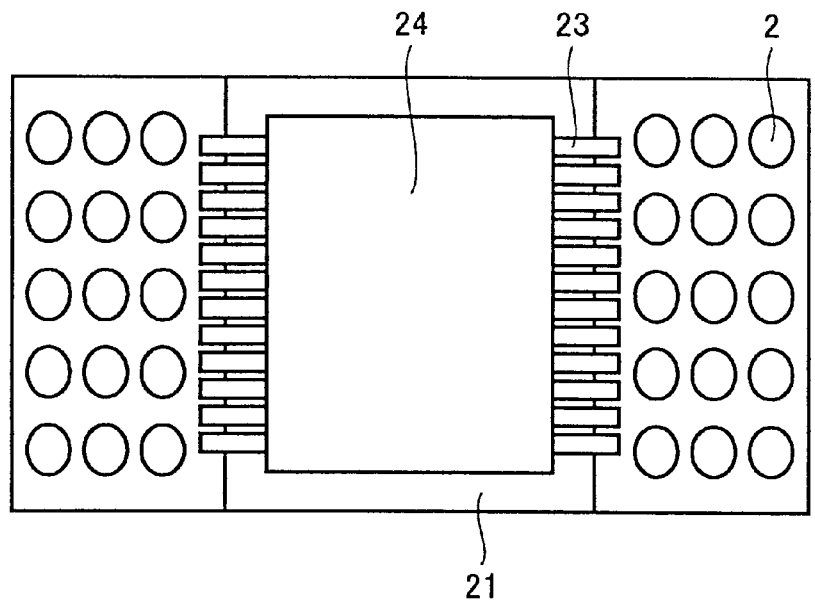
FIG. 14 is a plan view of the semiconductor module of FIG. 13 seen from the underside.

As shown in FIGS. 13 and 14, on the surface side, three semiconductor packages 4a, 4b, and 4c are disposed whose lead nominal dimensions of external leads and package heights all differ. On the other hand, on the underside, a recessed portion 21 for receiving a semiconductor package 24 is provided in mounting substrate 1. An external lead 23 of semiconductor package 24 disposed in the recessed portion on the underside is connected to an electrode pattern (not shown) outside of the recessed portion.

Since a semiconductor package is received in the recessed portion, the height of the semiconductor module becomes extremely low, which contributes to higher density packaging and smaller volume of the semiconductor module.

Figure 15:
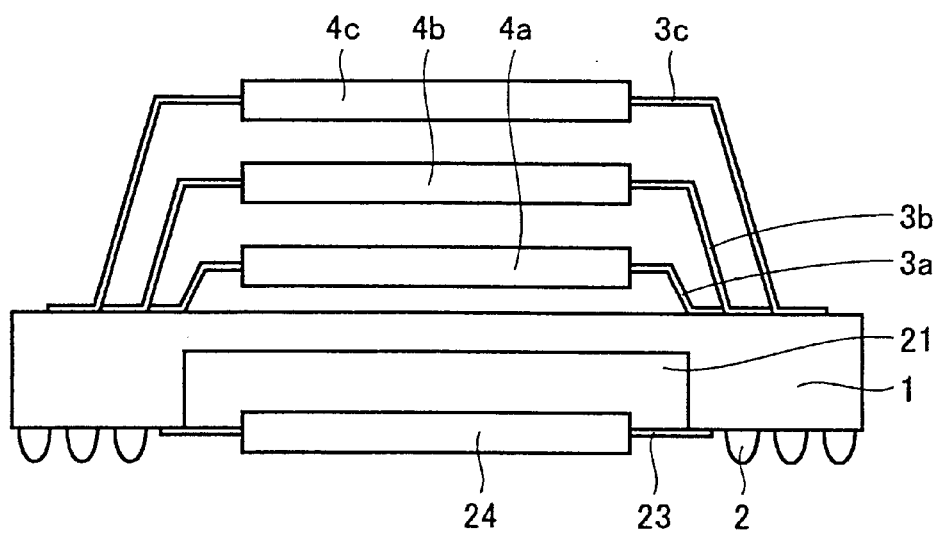
FIG. 15 is a front view of a modification of the semiconductor module according to the sixth embodiment of the present invention.

FIG. 15 is a front view of a semiconductor module of a modification to the sixth embodiment. While the semiconductor package received in the recessed portion on the underside of the semiconductor module in FIG. 13 has a gull-wing type external lead, the semiconductor module shown in FIG. 15 has a linear external lead. The semiconductor module of this modification also allows for reduced height without a problem, thereby achieving smaller scale and higher density packaging.

Seventh Embodiment

Figure 16:
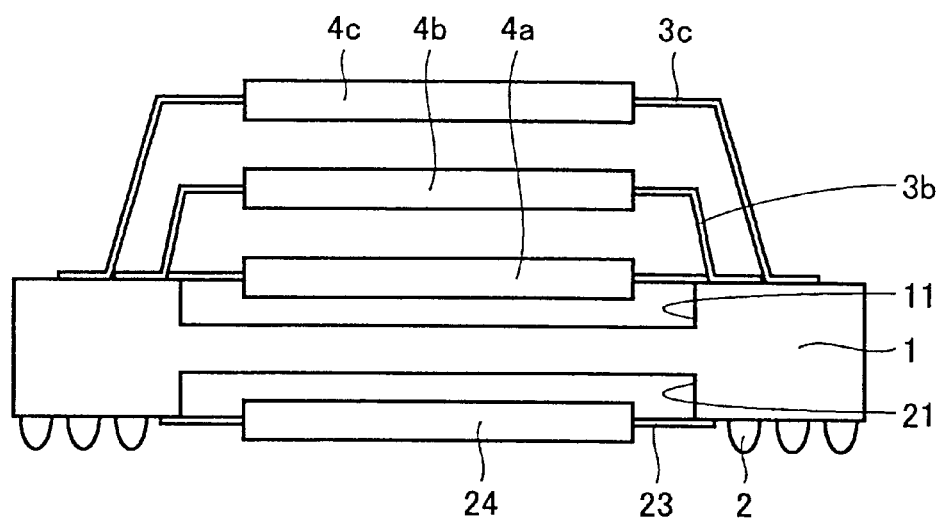
FIGS. 16 and 17 are front views of semiconductor modules according to the seventh and eighth embodiments of the present invention.

As shown in FIG. 16, a mounting substrate 1 is provided not only with a recessed portion 21 on the underside but also with a recessed portion 11 on the surface side. The structure in other portions are the same as that of the semiconductor module according to the sixth embodiment. This embodiment provides recessed portions to both the surface side and the underside, and receives the semiconductor packages therein. The semiconductor packages received in the recessed portions both have flat type external leads. The structure shown in FIG. 16 achieves the lowest height for the semiconductor module. Consequently, the volume can be made the smallest, which greatly contributes to achieving smaller scale and higher density packaging.

Eighth Embodiment

Figure 17:
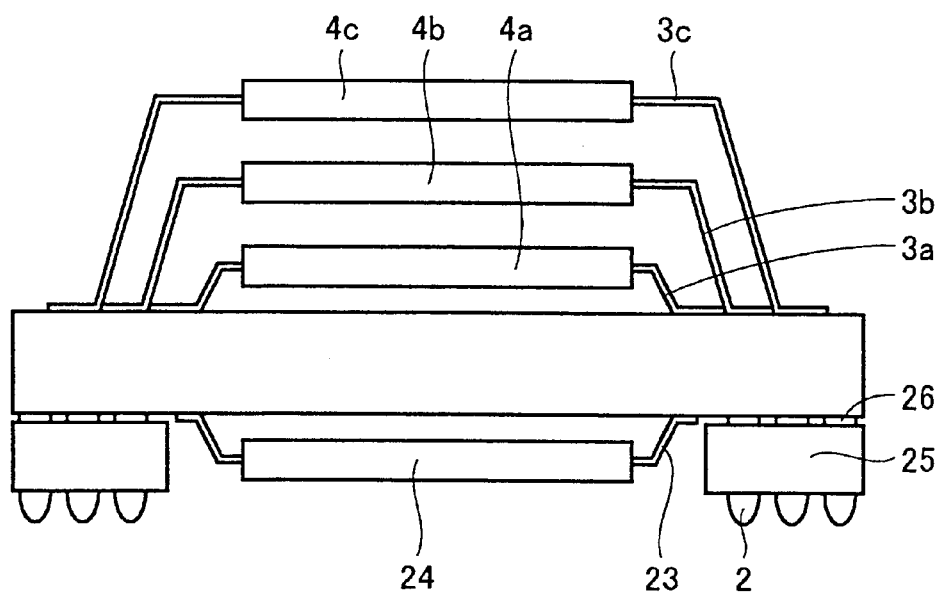
Figure 18:
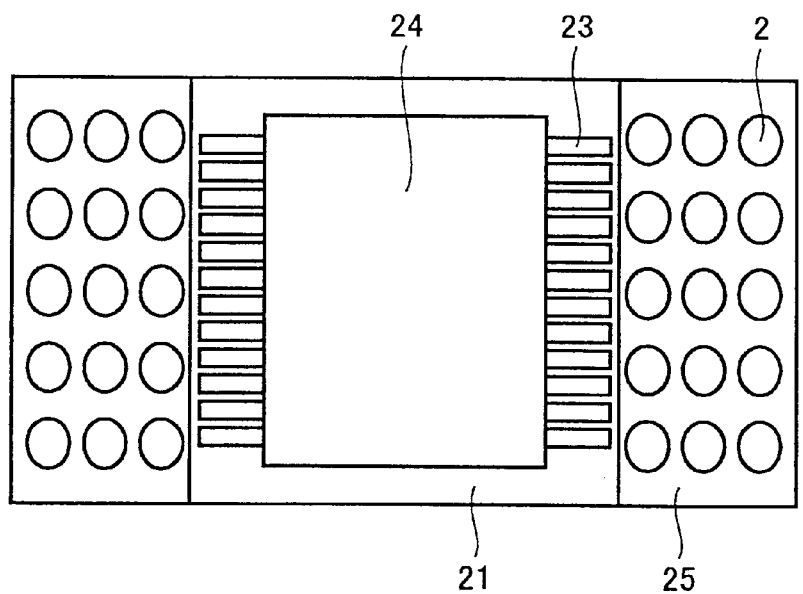
FIG. 18 is a plan view of the semiconductor module of FIG. 17 seen from the underside.

As shown in FIGS. 17 and 18, according to the eighth embodiment, two spacer substrates 25 connected with solder material 26 to the interconnection pattern of the mounting substrate are provided on outer portions on the underside of the mounting substrate. A spacer substrate is provided with a solder ball 2. A recessed portion is formed between these two spacer substrates 25, and semiconductor package 24 can be received in this recessed portion. With such structure, a recessed portion can be easily and conveniently formed on the underside. Thus, high density packaging can be readily achieved by disposing two or more semiconductor packages on the surface side and also disposing a semiconductor package on the underside with ease.

Ninth Embodiment

Figure 19:
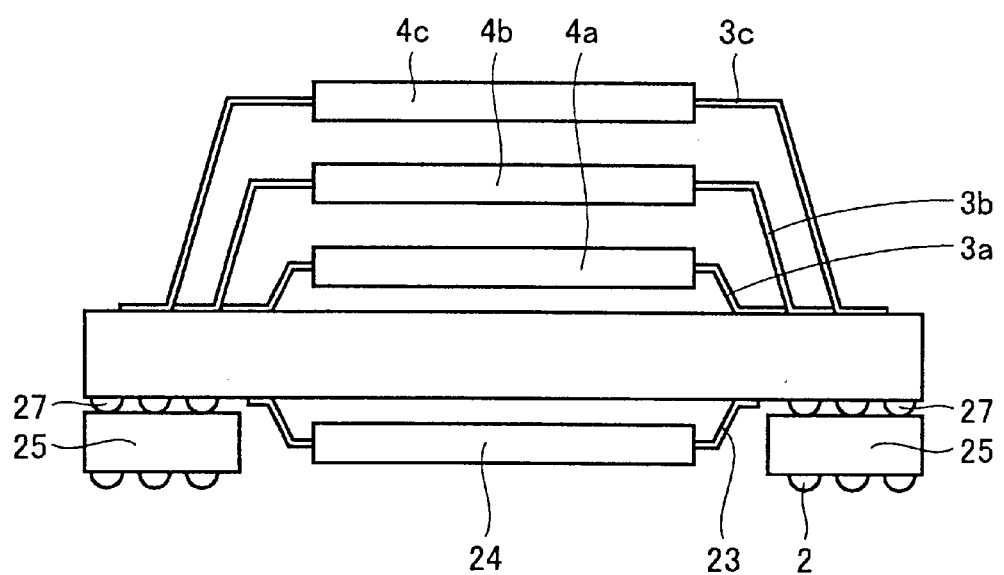
FIG. 19 is a front view of a semiconductor module according to a ninth embodiment of the present invention.

The semiconductor module shown in FIG. 19 is characterized in that the interconnection pattern (not shown) of a spacer substrate is connected to a solder ball 27 provided on the underside of a mounting substrate 1. The connection to another electronic component of the semiconductor module is provided by a solder ball 2 provided on a spacer substrate 25. As compared with the semiconductor module according to the eighth embodiment, a recessed portion can be more easily formed on the underside and a semiconductor package can be more readily received in the recessed portion in this semiconductor module. As a result, high density packaging can be easily achieved by disposing two or more semiconductor packages on the surface side and further disposing a semiconductor package on the underside with ease.

Tenth Embodiment

Figure 20:
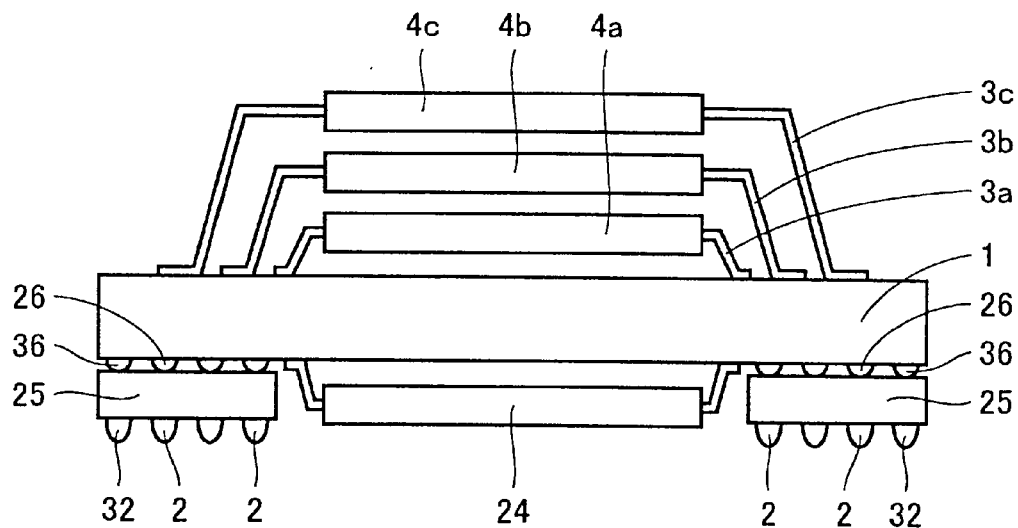
FIG. 20 is a front view of a semiconductor module according to a tenth embodiment of the present invention.
Figure 21:
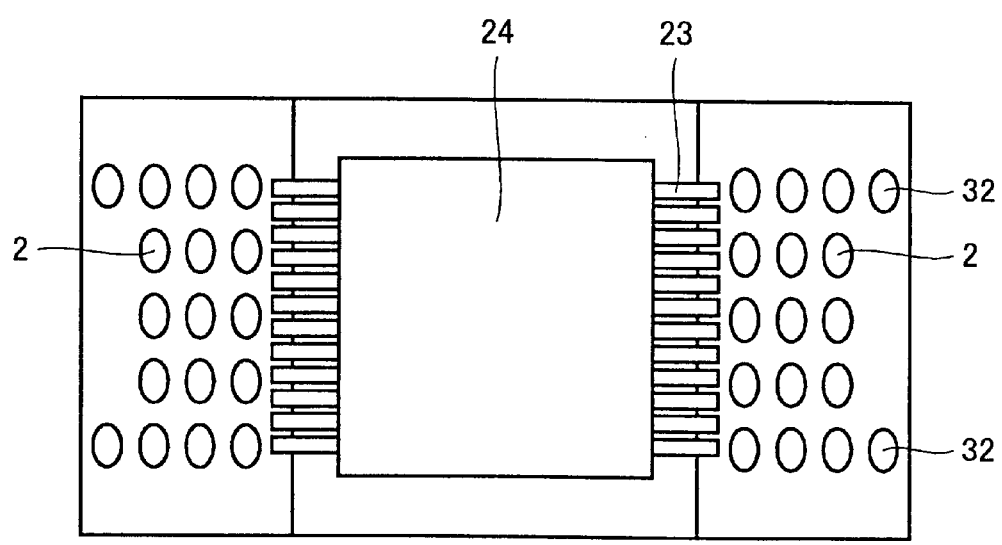
FIG. 21 is a plan view of the semiconductor module of FIG. 20 seen from the underside.

FIG. 20 is a front view of a semiconductor module according to the tenth embodiment of the present invention. In addition, FIG. 21 is a plan view of the semiconductor module of FIG. 20 seen from the underside. The tenth embodiment is characterized in that dummy solder balls 32 are disposed on the underside of mounting substrate 1 and on the underside of a spacer substrate 25.

In FIG. 20, semiconductor packages 4a, 4b, and 4c having varying package heights and external leads 3a, 3b, and 3c with varying lead nominal dimensions are mounted on a surface of a mounting substrate. In addition, on the underside of the mounting substrate, spacer substrate 25 having dummy solder ball 32 in addition to solder ball 2 is connected using a conductive solder material 26 and the like. Besides solder material 26, a dummy solder material 36 is disposed on the underside of mounting substrate 1, and is connected to a dummy top surface pad of spacer substrate 25. Disposition of such spacer substrates forms a recessed portion toward the center of the underside of the mounting substrate. A semiconductor package 24 with a lead of gull-wing type is disposed in this recessed portion.

Figure 22:
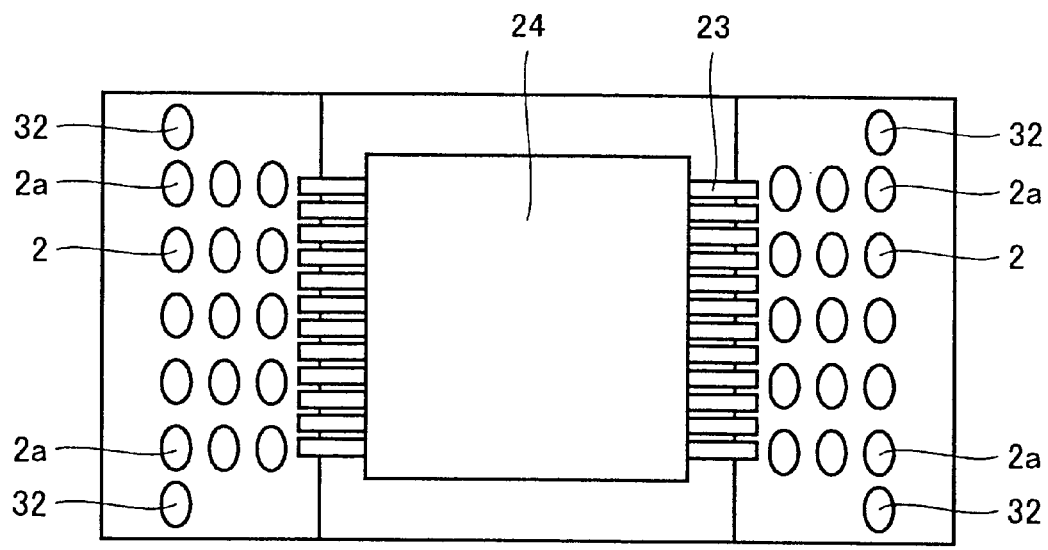
FIG. 22 is a plan view seen from the underside of another semiconductor module according to the tenth embodiment of the present invention.

FIG. 22 is a plan view seen from the underside of the above-described semiconductor module. An arrangement of dummy solder ball 32 can be known from this diagram. Here, dummy solder ball 32 and dummy solder material 36 are disposed not for signal output and such but for limiting heat distortion. In order to allow sharing of the stress and to suppress the distortion without causing disorder to the array of normal solder balls for signal output and such, it is desirable to place dummy solder balls 32 as farther outward as possible from the array of solder balls 2. Four dummy solder balls 32 are disposed in FIG. 21. Instead of the arrangement in FIG. 21, the arrangement of dummy solder balls may be as shown in FIG. 22.

Figure 23:
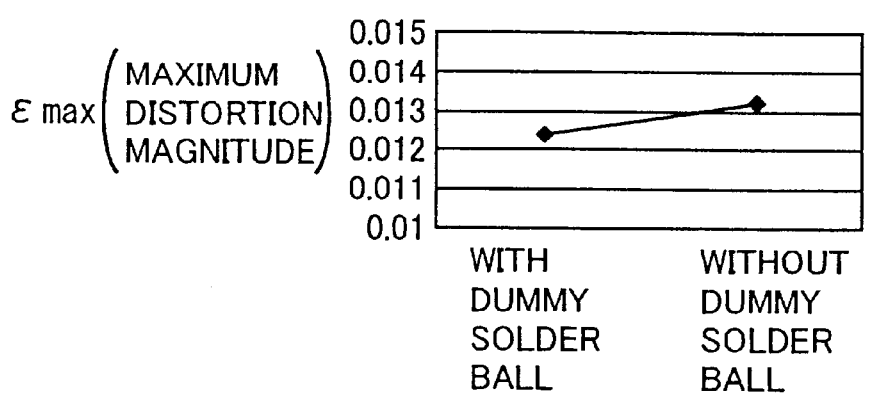
FIG. 23 is a diagram illustrating the effect of a dummy solder ball in the tenth embodiment of the present invention.

FIG. 23 is a diagram illustrating a result of simulation of maximum distortion magnitude that occurs in a solder ball 2a in the case where, with the arrangement of dummy solder balls 32 shown in FIG. 22, a dummy solder ball 32 and a solder ball 2 are connected to the mother substrate, and a temperature change between 0° C. and 100° C. occurs. Solder ball 2a for which the simulation of maximum distortion magnitude is performed is the solder ball in an outer corner portion closest to dummy solder ball 32, which is a location where the greatest distortion is expected to occur. As shown in FIG. 23, it can be seen that the disposition of dummy solder ball 32 limits the maximum distortion magnitude of solder ball 2a when heat cycle is applied. Consequently, by disposing dummy solder ball 32, reliability can be improved not only in solder ball 2a in the corner portion but also in the junctions of all solder balls. Thus, an even higher reliability of the junction can be achieved than in the semiconductor module according to the ninth embodiment.

The improvement in the reliability in the junction for circuit arrangement owing to the disposition of dummy solder balls described above is not limited to a semiconductor module having a spacer substrate on the underside, but is utilized for all the semiconductor modules according to the first to ninth embodiments described above, and the same effects are achieved.

Eleventh Embodiment

Figure 24:
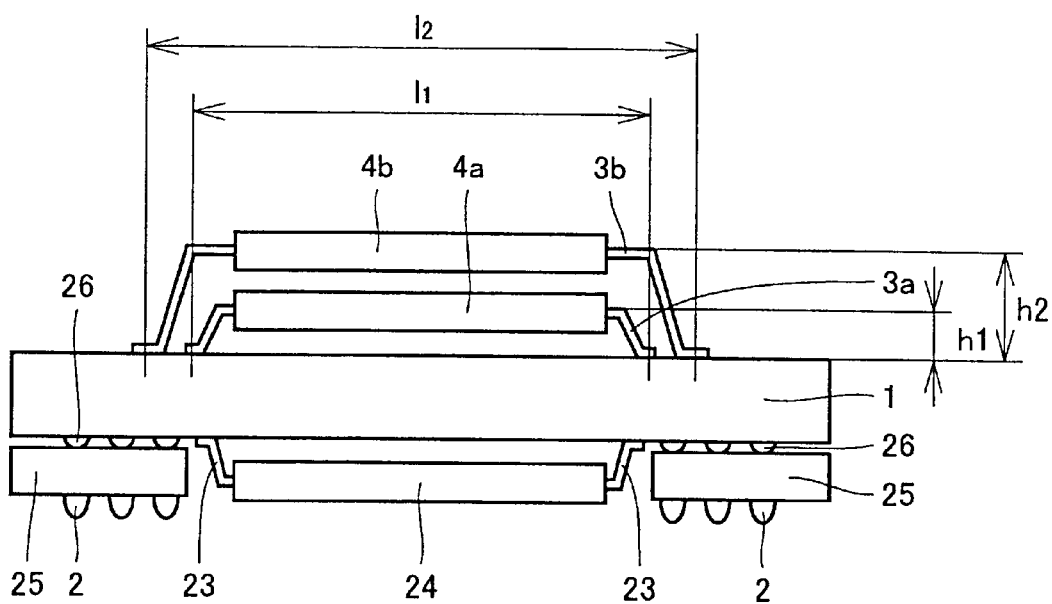
FIG. 24 is a front view of a semiconductor module according to an eleventh embodiment of the present invention.
Figure 25:
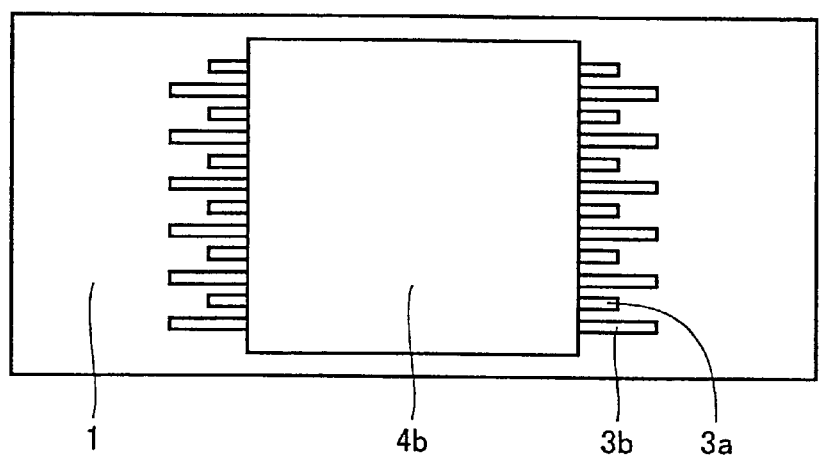
FIG. 25 is a plan view of the semiconductor module of FIG. 24 seen from the surface (top surface) side.

FIG. 24 is a front view of a semiconductor module according to the eleventh embodiment of the present invention. In addition, FIG. 25 is a plan view of the top surface of the same semiconductor module. The eleventh embodiment is characterized in that, while the body portion of semiconductor packages 4a and 4b on the surface side overlap one another when seen in a plane and are mounted in multiple layers, gull-wing type external leads 3a and 3b are disposed so as not to overlap when seen in a plane.

As shown in FIG. 24, two semiconductor packages 4a and 4b on the surface side are disposed in multiple layers with different package heights $h_1$ and $h_2$ and different lead nominal dimensions $l_1$ and $l_2$. Moreover, spacer substrates 25 having solder balls 2 are connected by solder material 26 to the underside of mounting substrate 1, providing a recessed portion in which semiconductor package 24 is disposed. This semiconductor package 24 also has a lead of gull-wing type.

According to FIG. 25, external leads 3a and 3b of two semiconductor packages 4a and 4b disposed on the top surface are arranged such that they do not overlap when seen in a plane. The external leads in a conventional example certainly do not overlap at a connecting portion of a connecting terminal and the mounting substrate; however, a connecting portion of external lead 3a of the lower semiconductor package overlaps a portion of external lead 3b that extends from the body toward a connecting portion of the upper semiconductor package when seen in a plane in the conventional example.

According to this arrangement, the visual inspection of a connecting portion of an external lead of the semiconductor packages mounted in multiple layers can be extremely facilitated, and significant improvement in the efficiency of the visual inspection process can be achieved. Although the example described above involves two layers of semiconductor packages mounted on the surface side, three layers of semiconductor packages may be mounted, and the external leads of the three semiconductor packages may be arranged such that they are each shifted by ⅓ pitch so that they do not overlap one another when seen in a plane, for instance. Indeed, the number of layers of semiconductor packages to be mounted may be further increased. The length of a side of a semiconductor package is limited, however, so that the increase in number is possible only so long as the number of the external leads necessary and the width of the external lead permit the above-described arrangement.

Twelfth Embodiment

Figure 26:
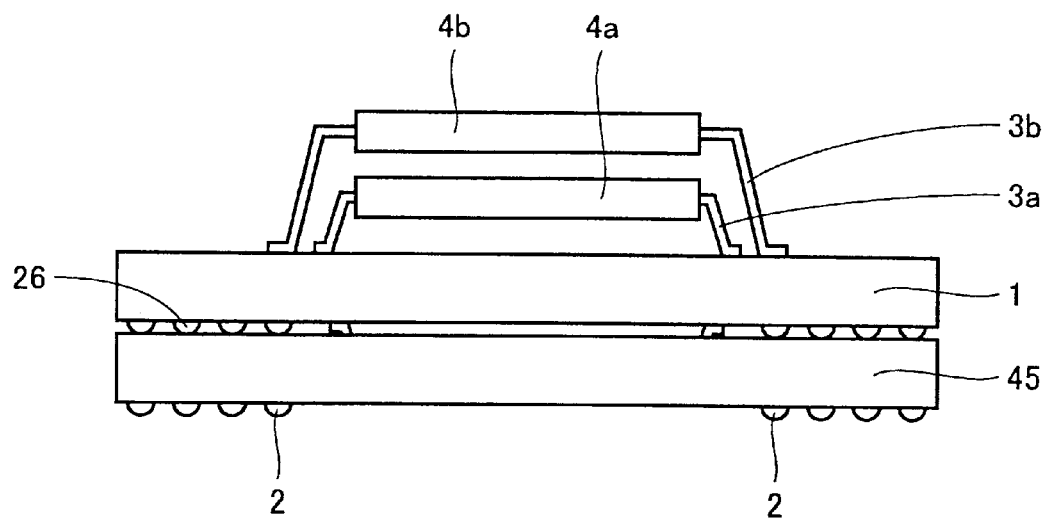
FIG. 26 is a front view of a semiconductor module according to a twelfth embodiment of the present invention.
Figure 27:
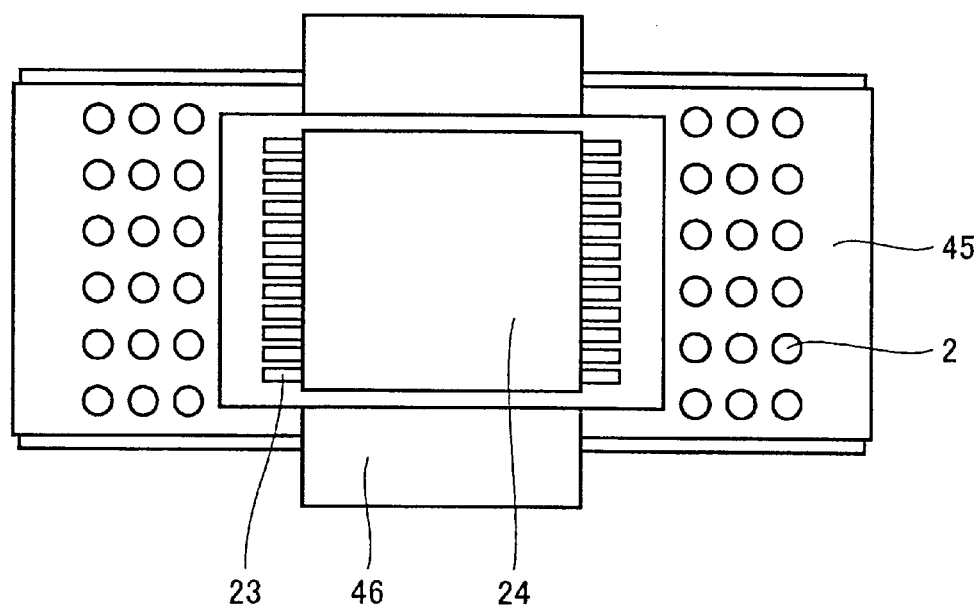
FIG. 27 is a plan view seen from the underside of the semiconductor module of FIG. 26 with a removing jig arranged thereon.
Figure 28:
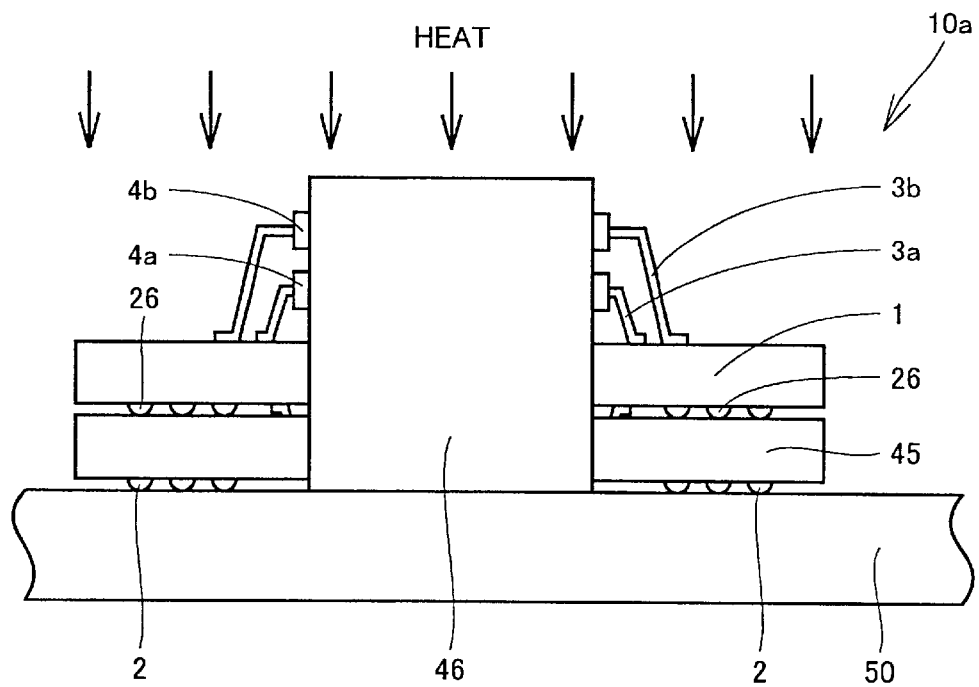
FIG. 28 is a front view showing the removing jig disposed so as to remove from a mother substrate the semiconductor module of FIG. 26 mounted on the mother substrate.

FIG. 26 is a front view of a semiconductor module according to the twelfth embodiment of the present invention. FIG. 27 is a plan view seen from the underside of this semiconductor module. FIG. 27 shows a removing jig being attached to the semiconductor module so as to remove the semiconductor module after the semiconductor module had once been connected to the mother substrate, for instance. Moreover, FIG. 28 is a front view showing a stage at which the removing jig is attached so as to remove the semiconductor module according to the present invention that is mounted on a mother substrate 50.

The twelfth embodiment is characterized in that a spacer substrate 45 disposed on the underside is a frame-like spacer substrate whose four sides are continuous. During the actual production of the semiconductor parts, malfunction of a semiconductor package 4a, for instance, may be discovered after the semiconductor packages are mounted on the mother substrate so that a semiconductor module 10a needs to be removed from mother substrate 50.

In such a case, if an attempt is made to pull out semiconductor module 10a after the semiconductor module and the corresponding portion of mother substrate 50 are heated, a spacer substrate having a conventional structure would sometimes remain on the mother substrate. When frame-like spacer substrate 45 described above is disposed, however, a removing jig 46 can be inserted between spacer substrate 45 and mother substrate 50, and spacer substrate 45 can be pulled out while being integrated with semiconductor module 10a. As a result, the defective portion, for instance, semiconductor package 4a alone, can be replaced and a semiconductor package can be mounted once again on mother substrate 50 without having to separate mounting substrate 1 and spacer substrate 45. Thus, it becomes possible to produce semiconductor parts with high yield.

The above-described frame-like spacer substrate can be utilized for all the semiconductor modules of the type having a spacer substrate disposed on the underside, and the same effects as those described above can be achieved.

Thirteenth Embodiment

Figure 29:
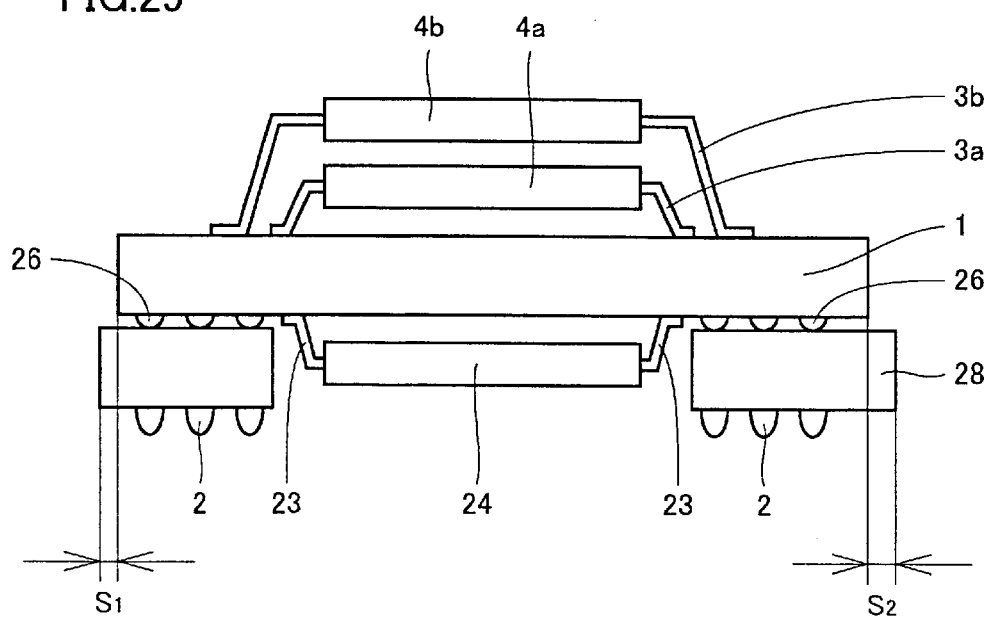
FIG. 29 is a front view of a semiconductor module according to a thirteenth embodiment of the present invention.

FIG. 29 is a front view of a semiconductor module according to the thirteenth embodiment of the present invention. The thirteenth embodiment is characterized in that end portions of spacer substrates 28 that are attached so as to dispose a semiconductor package 24 on the underside of a mounting substrate 1 protrude outward from the end portions of mounting substrate 1. In FIG. 29, an end portion of spacer substrate 28 extends outward from an end portion of mounting substrate 1 by S1 or S2. S1 and S2 may be the same or they may be different.

In the production of the semiconductor modules, for the purpose of improving production efficiency, a method is commonly employed in which, instead of producing the individual semiconductor modules separately, a plurality of semiconductor modules are produced at once and are finally divided into separate individual semiconductor modules. With semiconductor modules having a conventional structure, there were cases in which erroneous cutting or damaging of mounting substrate 1 took place when the division was effected to produce separate semiconductor modules.

Figure 30:
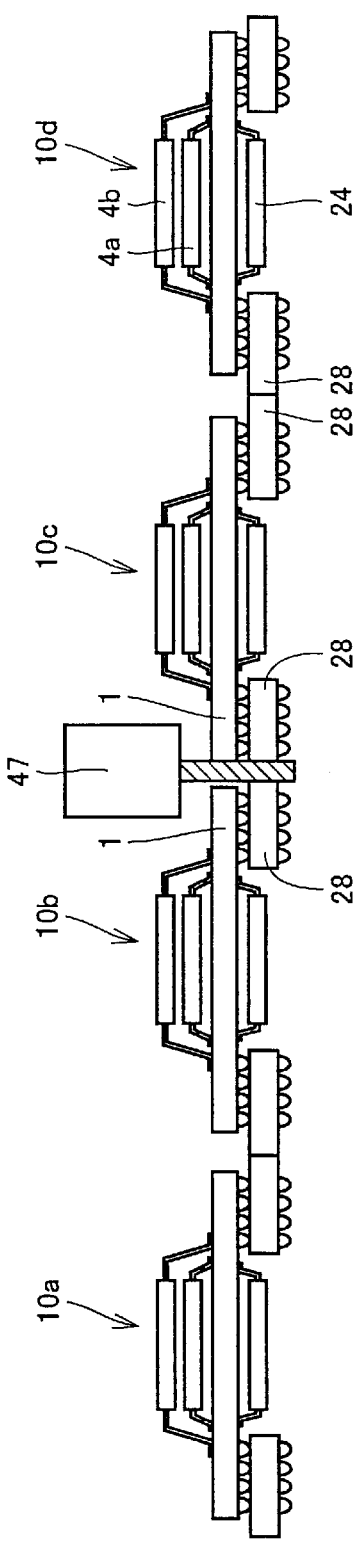
FIG. 30 is a schematic diagram illustrating a mounting substrate-dividing machine dividing a plurality of semiconductor modules of FIG. 29 produced at the same time.
Figure 31:
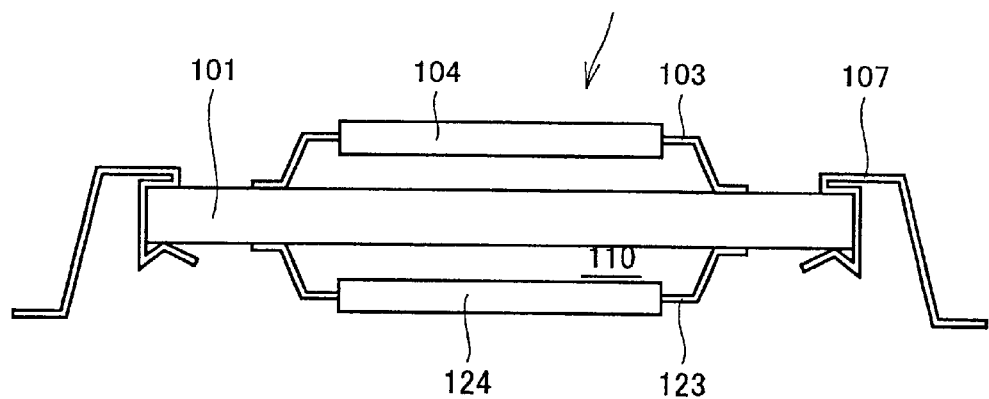
FIG. 31 is a front view of a conventional semiconductor module.
Figure 32:
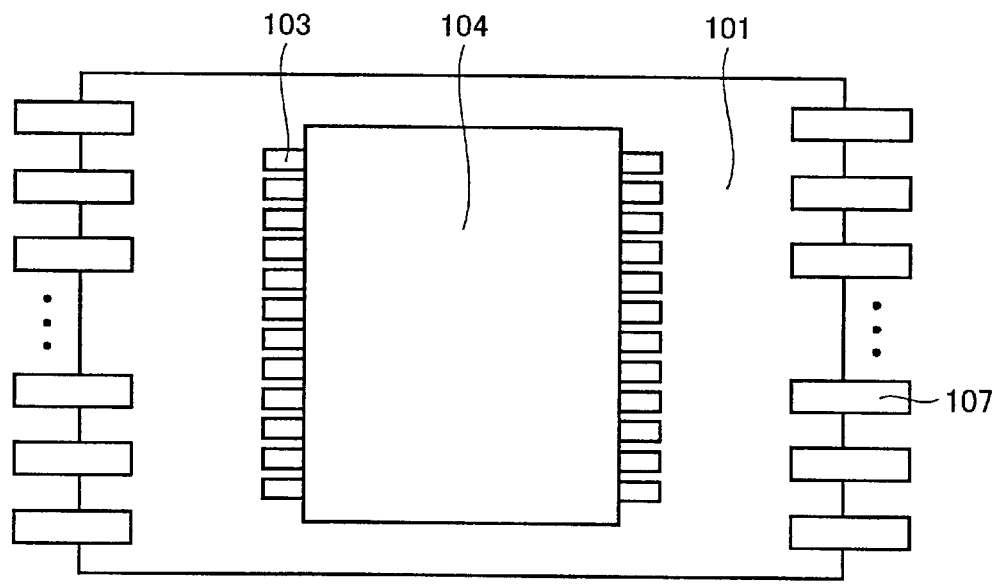
FIG. 32 is a plan view of the semiconductor module shown in FIG. 31.

As described above, by adopting a structure in which the end portion of spacer substrate 28 protrude from the end portions of a mounting substrate, portions separated by space are created between the mounting substrates of the semiconductor modules as shown in FIG. 30. Consequently, when the mounting substrates are separated by a mounting substrate-dividing machine 47 so as to separate semiconductor modules 10a, 10b, 10c, and 10d into individual semiconductor modules, a tip of mounting substrate-dividing machine 47 can be easily inserted into the locations of division. As a result, it becomes possible to produce the semiconductor modules with high yield and high efficiency without erroneously cutting or damaging the mounting substrates.

The above-described spacer substrate whose end portions protrude from the mounting substrate can be utilized for all the semiconductor modules of the type having a spacer substrate disposed on the underside, and the same effects can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor module comprising:
a mounting substrate including electrodes and, on an underside, solder balls for connecting to an interconnection of another electronic component; and
a plurality of semiconductor packages mounted in multiple layers on a top side of said mounting substrate, each semiconductor package including a semiconductor chip, a resin encapsulation completely encapsulating said semiconductor chip and having top and bottom surfaces, respective side surfaces transverse to said top and bottom surfaces, and lead terminals extending outwardly only from the side surfaces, said lead terminals being connected to said electrodes, wherein said top and bottom surfaces of adjacent semiconductor packages are disposed opposite each other in said multiple layers and generally parallel to said underside and said top side of said mounting substrate, separation between said electrodes to which said lead terminals of respective semiconductor packages are connected is different for each of said semiconductor packages and increases with distance of the respective semiconductor package from said mounting substrate, and the distances between said mounting substrate and respective semiconductor packages are different for each of said semiconductor packages.

2. A semiconductor module comprising:
a mounting substrate including electrodes and, on an underside, solder balls for connecting to an interconnection of another electronic component;
a plurality of semiconductor packages mounted in multiple layers on a top side of said mounting substrate, each semiconductor package including a semiconductor chip, a resin encapsulation completely encapsulating said semiconductor chip and having top and bottom surfaces, respective side surfaces transverse to said top and bottom surfaces, and lead terminals extending outwardly only from the side surfaces, said lead terminals being connected to said electrodes, wherein said top and bottom surfaces of adjacent semiconductor packages are disposed opposite each other in said multiple layers and generally parallel to said underside and said top side of said mounting substrate; and
sub-substrates, each sub-substrate having an interconnection pattern and an external lead and having a smaller planar size than said mounting substrate, said sub-substrates being arranged in multiple layers on said mounting substrate, wherein said external lead of each of said sub-substrates is connected to an electrode of said mounting substrate, and said semiconductor packages are mounted on said sub-substrates.

3. A semiconductor module comprising:
a mounting substrate including electrodes and an indentation electrode filled with solder on a top side and, on an underside, a solder ball for connecting to an interconnection of another electronic component;
a plurality of semiconductor packages mounted in multiple layers on said top side of said mounting substrate and connected to said electrodes;
a plurality of sub-substrates, each sub-substrate having an interconnection pattern and a through hole and a smaller planar size than said mounting substrate; and
a continuous contact pin that passes through the through holes of each of said sub-substrates, said sub-substrates being arranged in multiple layers on said mounting substrate and supported by said contact pin, wherein
said contact pin is connected to said interconnection pattern of one of said sub-substrates via the through holes,
an end of said contact pin is embedded in said solder in said indentation electrode of said mounting substrate, and said semiconductor packages are mounted on said sub-substrates.

4. A semiconductor module comprising:

a mounting substrate including electrodes and, on an underside, solder balls for connecting to an interconnection of another electronic component; and a plurality of semiconductor packages mounted in multiple layers on a top side of said mounting substrate, each semiconductor package including a semiconductor chip, a resin encapsulation completely encapsulating said semiconductor chip and having top and bottom surfaces, respective side surfaces transverse to said top and bottom surfaces, and lead terminals extending outwardly only from the side surfaces, said lead terminals being connected to said electrodes, wherein said top and bottom surfaces of adjacent semiconductor packages are disposed opposite each other in said multiple layers and generally parallel to said underside and said top side of said mounting substrate, wherein said top side of said mounting substrate includes a recess that reduces thickness of said mounting substrate across a range including said semiconductor packages, when viewed in a plane perpendicular to said top side of said mounting substrate.

5. The semiconductor module according to claim 1, including one of said semiconductor packages mounted on said underside of said mounting substrate and connected to an electrode on said underside of said mounting substrate.

6. A semiconductor module comprising:

a mounting substrate including electrodes, and, on an underside, a solder ball for connecting to an interconnection of another electronic component and a recessed portion;

a plurality of semiconductor packages mounted in multiple layers on a top side of said mounting substrate and connected to said electrodes; and an additional semiconductor package mounted on the underside of said mounting substrate, disposed within the recessed portion, and connected to an electrode on the underside of said mounting substrate, wherein the recessed portion reduces thickness of said mounting substrate across a range including said semiconductor packages, when viewed in a plane perpendicular to the top side of said mounting substrate.

7. A semiconductor module comprising:

a mounting substrate including electrodes and, on an underside, a solder ball for connecting to an interconnection of another electronic component;

a plurality of semiconductor packages mounted in multiple layers on a top side of said mounting substrate and connected to said electrodes;

an additional semiconductor package mounted on the underside of said mounting substrate and connected to an electrode on the underside; and a plurality of spacer substrates, each spacer substrate including an interconnection pattern and a solder ball disposed on the underside of said mounting substrate in locations outside of said additional semiconductor package located on the underside, when viewed in a plane, wherein said additional semiconductor package disposed on the underside is disposed between said spacer substrates.

8. The semiconductor module according to claim 7, including solder connecting said spacer substrates to said mounting substrate.

9. The semiconductor module according to claim 8, wherein said solder is a solder ball attached to said mounting substrate, and the spacer substrates each have a solder ball connecting the spacer substrates to said mounting substrate.

10. The semiconductor module according to claim 7, including a dummy solder material forming a junction that is not utilized for signal transmission on the underside of said semiconductor module.

11. The semiconductor module according to claim 7, wherein the spacer substrate disposed on the underside of said mounting substrate is a frame-like spacer substrate having four continuous sides surrounding the semiconductor package disposed on the underside.

12. The semiconductor module according to claim 7, wherein the spacer substrate disposed on the underside of said mounting substrate includes a portion that protrudes outward from said mounting substrate, when viewed in a plane.

13. The semiconductor module according to claim 1, wherein said lead terminals of said semiconductor packages mounted in multiple layers on said mounting substrate are arranged so that one lead terminal does not overlap another lead terminal, when viewed in a plane perpendicular to said top side of said mounting substrate.

14. An electronic component having a semiconductor module according to claim 1 mounted thereon, including a solder ball disposed on an underside of said semiconductor module and connected to an electrode of an interconnection pattern of the electronic component.

15. An electronic component having a semiconductor module according to claim 7 mounted thereon, including a solder ball disposed on an underside of said semiconductor module and connected to an electrode of an interconnection pattern of the electronic component.

16. An electronic component having a semiconductor module according to claim 10 mounted thereon, including a solder ball disposed on an underside of said semiconductor module and connected to an electrode of an interconnection pattern of the electronic component.

* * * * *